United States Patent [19]

Zagar et al.

[11] Patent Number: 5,315,177

[45] Date of Patent: May 24, 1994

[54] ONE TIME PROGRAMMABLE FULLY-TESTABLE PROGRAMMABLE LOGIC DEVICE WITH ZERO POWER AND ANTI-FUSE CELL ARCHITECTURE

[75] Inventors: Paul S. Zagar; Kurt P. Douglas, both of Boise, Id.

[73] Assignee: Micron Semiconductor, Inc., Boise, Id.

[21] Appl. No.: 30,896

[22] Filed: Mar. 12, 1993

[51] Int. Cl.⁵ .......................................... H03K 19/173
[52] U.S. Cl. ...................................... 307/465; 307/469
[58] Field of Search ......................... 307/465, 468–469

[56] References Cited

U.S. PATENT DOCUMENTS

| | | | |
|---|---|---|---|
| 3,423,646 | 1/1969 | Cubert et al. | |
| 3,566,153 | 2/1971 | Spencer, Jr. | 307/205 |
| 4,124,899 | 11/1978 | Berkner et al. | 364/716 |
| 4,499,557 | 2/1985 | Holmberg | 365/163 |
| 4,569,120 | 2/1986 | Stacy et al. | 29/574 |
| 4,569,121 | 2/1986 | Lim et al. | 29/574 |
| 4,717,912 | 1/1988 | Hawey et al. | 340/825.83 |
| 4,758,746 | 7/1988 | Berkner et al. | 307/465 |
| 4,763,020 | 8/1988 | Takata et al. | 307/465 |
| 4,796,075 | 1/1989 | Whitten | 357/51 |
| 4,910,417 | 3/1990 | El Gamal | 307/465 |
| 4,914,055 | 4/1990 | Gordon et al. | 437/192 |
| 4,963,769 | 10/1990 | Hiltpold | 307/468 |
| 4,983,959 | 1/1991 | Breuninger | 307/465 |
| 5,008,855 | 4/1991 | Eltoukhy et al. | 365/96 |
| 5,012,135 | 4/1991 | Kaplinsky | 307/465 |
| 5,019,532 | 5/1991 | Kaya | 437/186 |
| 5,019,878 | 5/1991 | Yang et al. | 357/23.3 |
| 5,068,696 | 11/1991 | Yang et al. | 357/23.1 |
| 5,070,384 | 12/1991 | McCollum et al. | 357/51 |
| 5,083,083 | 1/1992 | El-Ayat | 307/468 |

Primary Examiner—Edward P. Westin
Assistant Examiner—Andrew Sanders
Attorney, Agent, or Firm—Michael W. Starkweather

[57] ABSTRACT

There is a zero power programmable logic device with a one time programmable and fully-testable anti-fuse cell architecture. Specifically, a half-latch and fuse cell circuit allows the PLD to use "zero power" during the standby period since the sense amps are not used to maintain the programmed logic. Additionally, the PLD is capable of being tested for logic gate and logic path integrity, and anti-fuse electrical parameters without permanently programming the anti-fuse.

12 Claims, 2 Drawing Sheets

ANTI-FUSE CELL OPERATION

| MODE | POC* | TM | DVC2 | PGMAF | PGM |
|---|---|---|---|---|---|
| NORMAL OPERATION | VCC | GND | VCC/2 | GND | GND |
| POWER UP | GND | GND | VCC/2+1 | GND | GND |
| PROGRAM "0" (POP) | VCC | GND | VCC/2+1 | VPP | VCC |
| PROGRAM "1" (NO POP) | VCC | GND | VCC/2+1 | VPP | GND |
| VERIFY "0" | VCC | GND | VCC/2+1 | Vbias | VCC |
| VERIFY "1" | VCC | GND | VCC/2+1 | GND | VCC |
| REFRESH MODE | VCC | VCC | VCC/2 | GND | GND |
| DUMMY LOAD MODE | PULSE1 | GND | VCC/2 | PULSE3 | PULSE2 |
| DUMMY LOAD INHIBIT | VCC | GND | GND | PULSE3 | PULSE2 |

FIG. 2

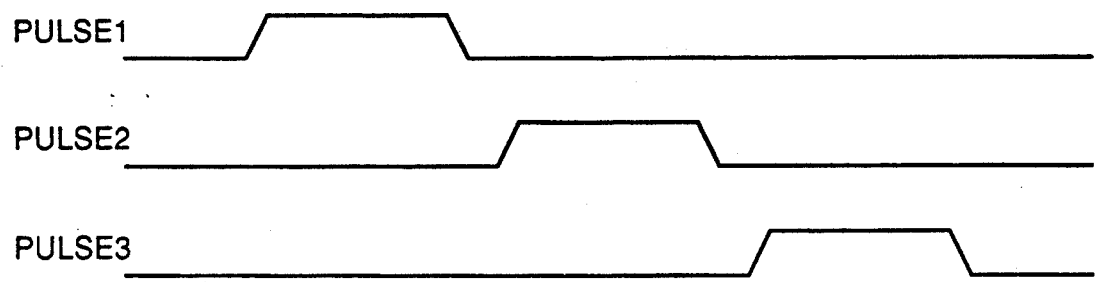

FIG. 3

ONE TIME PROGRAMMABLE FULLY-TESTABLE PROGRAMMABLE LOGIC DEVICE WITH ZERO POWER AND ANTI-FUSE CELL ARCHITECTURE

CROSS-REFERENCES TO RELATED OR COPENDING APPLICATIONS

U.S. patent application Ser. No. 07/865,007, filed Apr. 8, 1992, is a field programmable logic array with speed optimized architecture, having common assignee with the present invention.

U.S. patent application Ser. No. 07/817,167, filed Jan. 6, 1992, is a CMOS logic cell for high-speed, zero-power programmable array logic devices, having common assignee with the present invention.

U.S. patent application Ser. No. 07/865,007, filed Apr. 8, 1992, is a field programmable logic array with speed optimized architecture, having common assignee with the present invention.

U.S. patent application Ser. No. 07/883,759, filed May 15, 1992, is a programmable logic device with a single parameter state decode, having common assignee with the present invention.

U.S. patent application Ser. No. 07/884,489, filed May 15, 1992, is a programmable logic device macrocell with two or array inputs, having common assignee with the present invention.

U.S. patent application Ser. No. 883,076, filed May 15, 1992, is a programmable logic device macrocell with an exclusive feedback line and an exclusive external input line, having common assignee with the present invention.

U.S. patent application Ser. No. 07/884,505, filed May 15, 1992, is a programmable logic device macrocell with an exclusive feedback line and an exclusive external input line for a combinatorial mode and accommodating two separate programmable or planes, having common assignee with the present invention.

U.S. patent application Ser. No. 07/883,843, filed May 15, 1992, is a programmable logic device macrocell with an exclusive feedback line and an exclusive external input line for a state counter or registered sum-of-products signal, having common assignee with the present invention.

U.S. patent application Ser. No. 07/883,078, filed May 15, 1992, is a programmable logic device macrocell with an exclusive feedback line and an exclusive external input line for registered and combinatorial modes using a dedicated product term for control, having common assignee with the present invention.

U.S. patent application Ser. No. 07/914,361, filed Jul. 15, 1992, is a field programmable logic array with a dual or plane macro-cell architecture.

FIELD OF THE INVENTION

The present invention relates to integrated circuits (ICs) architecture. Particularly, there is a Programmable Logic Device, ("PLD") that uses a one time programmable anti-fuse element. Uniquely, a half-latch and fuse cell circuit allows the PLD to use "zero power" during the standby period since the sense amps are not used to maintain the programmed logic. Additionally, the PLD is capable of being tested for logic gate and logic path integrity, and anti-fuse electrical parameters without permanently programming the anti-fuse.

BACKGROUND OF THE INVENTION

Historically

The introduction of programmable logic devices (PLD) was a true revolution in the hardware design world. It enabled engineers to shrink circuits requiring several devices onto a single device thus simplifying their designs while saving space and power. Traditionally, PLDs have been used in combinatorial circuits such as address decoders as well as sequential circuits such as bus arbitration schemes. During the last few years, advances and improvements in PLD architectures enabled the devices to grow more complex while addressing the never-ending quest for higher density and faster speeds. Despite these improvements, engineers still face certain problems and limitations with PLDs.

A typical programmable logic device is composed of a user-programmable AND array, a fixed OR gate, followed by an output register which includes a feedback path from the output to the programmable AND array. PLDs also have circuitry for programming the inputs to the AND and OR arrays, and for configuring the output macrocells.

Problems

Most PLD architectures have several problems related to the standby current. Standby current is the current required by the chip existing between successive inputs to the chip. In other words, its the current needed to keep the chip ready for action. Typical PLDs use huge amounts of current during the standby mode, ranging around the hundreds of milliamps. This amount of current is an excessive waste when considering the limited life of most batteries used in portable computers.

Additionally, other PLDs have gone to the extreme of powering down the chip during standby periods. However, though the chip will not use current during the standby period, it will take typically 15 or more nanoseconds to power up the chip again. This situation creates a huge timing problem which prevents use in designs requiring 10 ns response time.

Another problem is that most PLDs use sense amps in the critical speed paths during normal operation. This has the effect of using a substantial amount of power during standby periods. Today's battery powered computers are severely limited with this type of power usage.

Furthermore, manufactures typically can not test one time programmable PLDs for functionality of the circuits before selling them to customers. In other words, the manufacturer will not be able to know what percentage of the IC is inoperative, or know what percentage of the total lot sold is defective. This adds extra costs and time delays to customers.

Therefore, a need exists for a one time programmable PLD capable of 1) "zero power" during the standby period, 2) testing the fuse electrical parameters, 3) check all of the logic gates for proper functionality, and 4) check all of the logic paths integrity.

It is noted that the above described problems, as well as other problems, are solved through the subject invention and will become more apparent, to one skilled in the art, from the detailed description of the subject invention.

SUMMARY OF THE INVENTION

One skilled in the art will appreciate the advantage of the a one time programmable fully-testable programmable logic device with zero power and anti-fuse cell architecture.

Specifically, one advantage of the invention is to provide "zero power" usage during the standby period. Another advantage is that the fuse capacitances can be tested by the manufacturer before shipping to customers without damage to the fuses.

Furthermore, an advantage is that the manufacturer can check all of the logic gates for proper functionality before selling the one time programmable chips without damaging the fuses.

Additionally, the manufacturer has the advantage of being able to check all of the logic paths integrity prior to selling the chips without damaging the fuses.

The subject PLD circuit advantageously uses the sense amps strictly for program verification operations, and not during normal operation periods. Thus, providing for a zero power usage during standby periods.

The anti-fuse cells are advantageously used to: 1) program inputs to the arrays, 2) configure the logic of the AND and OR arrays, and 3) configure the macrocell output configurations.

Another advantage of this invention is that there is no need of powering down the chip during standby periods.

Other features and objects of the present invention will become more clear from the following detailed description of the invention, taken in conjunction with the accompanying drawings and claims, or may be learned by the practice of the invention.

BRIEF DESCRIPTION OF THE DRAWINGS

FIG. 2 is an operation chart for the anti-fuse cell.
FIG. 3 is a timing chart for the invention.

Figure 1:
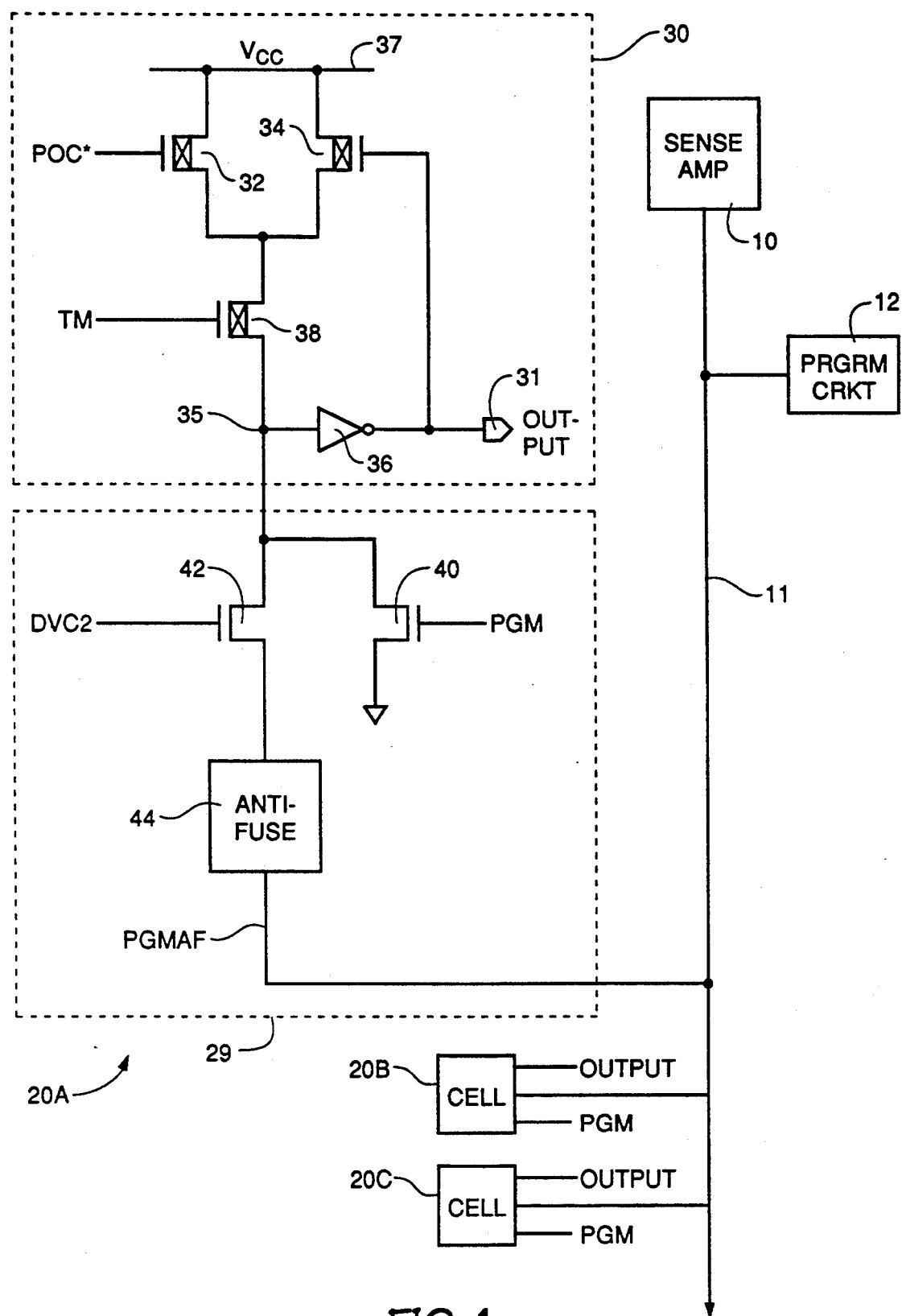
FIG. 1 is a detailed illustration of the invention.

It is noted that the drawings of the invention are not to scale. The drawings are merely schematic representations, not intended to portray specific parameters of the invention. The drawings are intended to depict only typical embodiments of the invention, and are therefore not to be considered limiting of its scope. The invention will be described with additional specificity and detail through the use of the accompanying drawings.

DETAILED DESCRIPTION OF THE ILLUSTRATED EMBODIMENT

This disclosure of the invention is submitted in furtherance of the constitutional purposes of the U.S. Patent Laws "to promote the progress of science and useful arts" (Article 1, Section 8 of the U.S. Constitution).

INCORPORATED MATERIAL

For the purpose of providing background material which may in some respects illustrate the state of the art, the following books (or articles or pamphlets) are herein incorporated by reference: "Programmable Logic Handbook," fourth edition, by Monolithic Memories Inc., 2175 Mission College Blvd., Santa Clara, Calif.; and "Practical Design Using Programmable Logic," by D. Pellerin and M. Holley, Prentice Hall, library of Congress no. TK7872 .L64 P44 1991.

The following U.S. patents are herein incorporated by reference for pertinent and supporting information:

U.S. Pat. No. 3,423,646, is a computer logic device consisting of an array of tunneling diodes, isolators and short circuits.

U.S. Pat. No. 3,566,153, is a programmable sequential logic device.

U.S. Pat. No. 4,124,899, is a programmable array logic circuit.

U.S. Pat. No. 4,499,557, is a programmable cell for use in programmable electronic arrays.

U.S. Pat. No. 4,569,120, is a method of fabricating a programmable read only memory cell incorporating an anti-fuse utilizing ion implantation.

U.S. Pat. No. 4,569,121, is a method of fabricating a programmable read only memory cell incorporating an anti-fuse utilizing deposition of amorphous semiconductor layer.

U.S. Pat. No. 4,717,912, is an apparatus for producing any one of a plurality of signals at a single output.

U.S. Pat. No. 4,758,746, is a programmable logic array with added array of gates and added output routing flexibility.

U.S Pat. No. 4,763,020, is a programmable logic device having plural programmable function cells.

U.S. Pat. No. 4,796,075, is a fusible link structure for integrated circuits.

U.S. Pat. No. 4,914,055, is a semiconductor anti-fuse structure and method.

U.S. Pat. No. 5,008,855, is a method of programming anti-fuse elements.

U.S. Pat. No. 5,019,532, is a method for forming a fuse and fuse made thereby.

U.S Pat. No. 5,019,878, is a programmable interconnect or cell using silicide MOS transistors.

U.S. Pat. No. 5,068,696, is a programmable interconnect or cell using silicide MOS transistors.

U.S Pat. No. 5,070,384, is an electrically programmable anti-fuse element incorporating a dielectric and amorphous silicon interlayer.

GENERAL EMBODIMENT

FIG. 1 is a detailed illustration of the invention and includes the following elements: There are two parts to the overall circuit, a half latch circuit 30, and a fuse cell circuit 29. There is a sense amp 10 connected to programmable cells 20 a, b, and c via digit, bit, or column line 11. There is a power rail Vcc 37. P-channel transistors are 32, 34, and 38, while N-channel transistors are 40, and 42. There is an anti-fuse element 44 coupled between transistor 42 and digit line 11. There are five input signals: 1) power on control (POC*) controlling transistor 32, test mode ("TM") controlling transistor 38, program ("PGM") controlling transistor 40, program anti-fuse ("PGMAF") controlling the programming of anti-fuse 44, and divided Vcc by 2 ("DVC2") or half Vcc, controlling transistor 42. There is an inverter 36 coupled to transistors 38, 40, and 42 as shown. Output 31 is coupled to receive inputs from inverter 36 and to send the programming information to the various parts of the IC requiring programming. There is a programming circuit 12, which will modify the voltage on the digit line 11 to Vpp, or to around 10–15 volts, for permanently programming anti-fuse 44.

OPERATION OF THE INVENTION

One skilled in the art should easily understand the operation of the invention in reference to FIG. 2 illustrating the timing of the invention's differing modes.

There is a normal operational mode which is selected to output either a zero or one signal to output 31.

There is a power up mode. This is typically the only time POC* is grounded. This sets all cells to a known Vcc state, and depending upon the anti-fuse setting, inverter 36 will output either a one or zero signal.

To program a zero, or pop of the anti-fuse, PGMAF is brought to Vpp or about 12 volts. This pops the anti-fuse element.

To program a one, or non-pop of the anti-fuse, PGM is brought to ground. Thus, not popping the anti-fuse element.

One skilled in the art will easily understand the verify "0" and "1", and the refresh mode operations in reference to FIG. 2.

Unique to the art is the ability to perform a "dummy" program operation. Specifically, this dummy program allows for testing the IC without permanently programming the anti-fuses. By forcing patterns of ones and zeros in the fuse half latches (32, 34, and 38) with voltages that are not high enough to pop the fuses, for example around 5 volts, testing of the entire circuitry can be performed without damage to the one time programmability of the anti-fuses.

To set up for testing of the IC, there is a three step process. First, pulse 1 will reset all fuse latches in the array to a logical one. Next, pulse 2 will load a zero on all the fuse latches in a single row or word line selected by the PGM signal. Finally, pulse 3 loads a logical one in a selected pattern of fuse latches on the single selected word line, via PGMAF. Thereby allowing testing of the IC functionality comprising the logic gates, logic paths, and anti-fuse capacitances.

One skilled in the art will understand that the dummy load inhibit mode, as illustrated, will stop the low test voltages from occurring on selected fuse locations.

To program anti-fuse 44, the PGMAF signal, from program circuit 12 via digit line 11, is brought up to about Vpp (10–15 volts), while the word line is simultaneously selected by the PGM signal. Verify mode is initiated to test the programming of the anti-fuses throughout the IC. A programmed or "one" anti-fuse will force the PGMAF line to "zero" while an unpopped or "zero" anti-fuse will leave a Vbias level on the PGMAF line.

Power up mode occurs when the IC is first powered up. It is noted that during the power up mode that POC* is pulsed low, thus charging node 35 to Vcc. If the anti-fuse is set to zero, then inverter 36 will output a low and thereby allow the power rail 37 to charge node 35 through transistor 34 instead of 32. If the anti-fuse is set to a one, voltage at node 35 will be pulled low through the anti-fuse and keep the inverter's output high. Once the POC* signal is disabled, the programming of the output 31 is set.

Additionally, it is pointed out that DVC2 is either half of Vcc or half Vcc plus one volt most of the time. It is generally know that dielectric anti-fuse cells tend to break down over time because of voltages stress or current leakage. By placing a voltage limiting or protection transistor before the anti-fuse, the total amount of stress is diminished. Thereby, increasing the life of the anti-fuse and inhibiting resistive changes over time.

REMARKS ABOUT THE INVENTION

It is noted that output 31 can be used to control various parts of the PLD. For example, the inputs to the AND and OR arrays, and the macrocell configurations can be controlled.

One skilled in the art will also recognize that the sense amps are used only for programming verification, and not used during normal operation. Thus, not using any power during standby periods.

Similarly, the use of an anti-fuse provides a means for not using any current in standby periods. If the fuses is not blown, or open, no current flows across it. If blown, there is no current provided from digit line 11 during standby mode.

A skilled artisan will notice the use of Vcc/2 power source for the DVC2 signal to transistor 42. This is to inhibit the known problems from the time dependent dielectric breakdown of the anti-fuse. Thus, prolonging the useful life of the anti-fuse.

Note that operating periods of a PLD are when the PLD is activated and performing logic-type function of the PLD. Whereas, standby periods are those times between operating periods when there is no performing of logic-type functions.

VARIATIONS IN THE INVENTION

There are several obvious variations to the broad invention and thus come within the scope of the present invention. Uniquely, this invention may work with any combination of transistors along the internal circuit paths. For example, pass gate transistors may be employed for obvious reasons. Similarly, laser fuses or other programmable transistors or capacitors may be employed over the anti-fuse embodiment. Additionally, although the embodiment is directed to PLDs, the application of the invention works equally as well for programmable redundancy in DRAMs, and other RAM devices.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

Although subheadings in the Detailed Description of the Illustrated Embodiment are used, these are merely provided for assisting the reader; wherein, the writer is free to enter any information under any heading/s.

What is claimed and desired to be secured by United States Patent is:

1. A programmable logic device, comprising:
   a sense amp (10);
   a programmable cells (20a) connected to the sense amp, having:
   a) a half latch circuit (30), wherein the output (31) from the half latch circuit is used to program various portions of the programmable logic device; and
   b) a fuse cell circuit (29), coupled to the half latch circuit, for setting the output of the half latch circuit to a high or low signal level.

2. The programmable logic device of claim 1, wherein said half latch circuit comprises:
   a power rail (Vcc 37); and
   a first (32) and second (34) P-channel transistor, each having the source electrically coupled to the power rail, and the drains coupled together.

3. The programmable logic device of claim 2, wherein the half latch circuit further comprises:
an inverter having electrical inputs from the drains of the first and second P-channel transistors, and having the output electrically coupled to the gate of the second P-channel transistor, the output of the inverter is the output of the half latch circuit for setting a state for various portions of the programmable logic device.

4. The programmable logic device of claim 3, wherein the half latch circuit further comprises:
a third P-channel transistor (38) having its source electrically coupled to the drains of the first and second P-channel transistors.

5. The programmable logic device of claim 4, wherein said fuse cell circuit comprises:
a first N-channel transistor (42) having the drain electrically coupled to the source of the third P-channel transistor; and
an anti-fuse cell (44) having:
a) an input coupled to a digit line (11) which is coupled to the sense amp; and
b) an output electrically coupled to the source of the first N-channel transistor (42).

6. The programmable logic device of claim 5, further comprising:
a second N-channel transistor (40) having the source coupled to the first N-channel transistor (42) and the third P-channel transistor (38), and its drain coupled to ground.

7. A PLD programming circuit, comprising:
an output line (31);
fuse circuit means (29), electrically coupled to the output line, having a low state for pulling the voltage of the first node down, and having a high state for maintaining the voltage on the first node; and
latching circuit means (30), coupled to the output line, having a first mode for outputting a high signal to the output line while the fuse circuit means is in a low state, and a second mode for outputting a low signal to the output line while the fuse circuit means is in a high state.

8. The PLD of claim 7, wherein the fuse circuit means comprises:
a first node (35), coupled between the fuse circuit and the half latch circuit;
a digit line (11), ;
an anti-fuse (44), coupled between the digit line and the first node (35), for enabling the high state on the first node when the anti-fuse is unprogrammed, and enabling the low state on the first node when the anti-fuse is programmed.

9. The PLD of claim 6, further comprising:
a protection circuit (42), coupled between the first node and the anti-fuse, for inhibiting the anti-fuse from breaking down over time.

10. The PLD of claim 9, further comprising:
a program transistor (40) for selectively enabling current through the anti-fuse during programming of the anti-fuse.

11. The programmable logic device of claim 1, wherein
the sense amp uses no power during operating periods of the programmable logic device.

12. The PLD programming circuit of claim 7, further comprising:
a) a programmable cell including the fuse circuit means and the latching circuit means;
b) a sense amp electrically coupled to the programmable cell; and
c) the sense amp using no power during operating periods of the PLD.

* * * * *